US008410791B2

(12) United States Patent
Tsukagoshi et al.

(10) Patent No.: US 8,410,791 B2
(45) Date of Patent: Apr. 2, 2013

(54) IMPULSE IMMUNITY TEST APPARATUS

(75) Inventors: Tsuneo Tsukagoshi, Minato-ku (JP);
Takeshi Watanabe, Kawasaki (JP);
Toshiyuki Nakaie, Wakayama (JP);
Nobuchika Matsui, Wakayama (JP)

(73) Assignees: NEC Corporation, Tokyo (JP); Renesas Electronics Corporation, Kanagawa (JP); Hanwa Electronic Ind. Co., Ltd., Wakayama (JP)

( * ) Notice: Subject to any disclaimer, the term of this patent is extended or adjusted under 35 U.S.C. 154(b) by 878 days.

(21) Appl. No.: 12/530,168

(22) PCT Filed: Mar. 6, 2008

(86) PCT No.: PCT/JP2008/054558
§ 371 (c)(1),
(2), (4) Date: Sep. 4, 2009

(87) PCT Pub. No.: WO2008/108503
PCT Pub. Date: Sep. 12, 2008

(65) Prior Publication Data
US 2010/0090710 A1 Apr. 15, 2010

(30) Foreign Application Priority Data
Mar. 6, 2007 (JP) .................................. 2007-055153

(51) Int. Cl.
*G01R 27/28* (2006.01)
*G01R 27/26* (2006.01)
(52) U.S. Cl. ......... 324/612; 324/600; 324/606; 324/679
(58) Field of Classification Search .................. None
See application file for complete search history.

(56) References Cited

U.S. PATENT DOCUMENTS 6,618,230 B2 *  9/2003  Liu et al. .......................... 361/56
8,063,645 B2 * 11/2011  Ravot et al. .................... 324/539

FOREIGN PATENT DOCUMENTS

| JP | 58-100759 A | 6/1983 |
| JP | 62-182674 A | 8/1987 |
| JP | 2-113176 U | 9/1990 |

(Continued)

OTHER PUBLICATIONS

Office Action dated Jun. 27, 2012 issued by the Japanese Patent Office in counterpart Japanese Patent Application No. 2009502645.

(Continued)

*Primary Examiner* — Jermele M Hollington
*Assistant Examiner* — Trung Nguyen
(74) *Attorney, Agent, or Firm* — Sughrue Mion, PLLC

(57) ABSTRACT

The application methods in the related art cannot apply a sufficient voltage with a rectangular wave having a short rise time to an electronic circuit. Furthermore, electrostatic discharge test can apply a sufficient voltage but can only apply an oscillating waveform.

A TLP generator is used as a rectangular wave generator. The sum of an injection resistance and a matching resistance is set so as to match the characteristic impedance of a transmission line for transmitting a rectangular wave to a test target. A capacitor is connected to a return line of the applied rectangular wave. With this configuration, stable application can be achieved. An error observation function of an electronic circuit gradually increases a peak value of the rectangular wave and determines the immunity based on an application voltage to cause an error for the first time.

8 Claims, 19 Drawing Sheets

FOREIGN PATENT DOCUMENTS

| | | |
|---|---|---|
| JP | 4-372204 A | 12/1992 |
| JP | 2000206177 A | 7/2000 |
| JP | 2000-329818 A | 11/2000 |
| JP | 2003-50262 A | 2/2003 |
| JP | 2004-85477 A | 3/2004 |
| JP | 3613269 B2 | 3/2004 |
| JP | 2004-309153 A | 11/2004 |
| JP | 2006-038542 A | 2/2006 |
| JP | 2006058118 A | 3/2006 |

OTHER PUBLICATIONS

IEC61000-4-2, "Electromagnetic compatibility (EMC)—Part 4-2: Testing and measurement techniques—Electrostatic discharge immunity test," International Standard, Edition 2.0, Dec. 2008, pp. 1-129, ISBN-2-8318-1019-7.

Japanese Office Action dated Sep. 12, 2012 issued by the Japanese Patent Office in counterpart Japanese Application No. 2009-502645.

* cited by examiner

IMPULSE IMMUNITY TEST APPARATUS

TECHNICAL FIELD

The present invention relates to a test apparatus for testing an immunity (noise resistance) of an electronic circuit in a case where a rectangular wave is used as noise.

BACKGROUND ART

Integration of electronic circuits has been developed along with reduction of the size and weight of electronic circuits. A power source voltage has been reduced along with miniaturization in LSI fabrication processes. Therefore, electronic circuits are relatively getting susceptible to noise. The immunity (noise resistance) of a device should be tested thoroughly, and various precautions should be taken prior to marketing of the device.

An electrostatic discharge test described in Non Patent Literature 1 (IEC61000-4-2 (the international standard of electrostatic discharge)) is generally known as an immunity test to an impulse.

Patent Literature 1 (Japanese Patent No. 3613269 (known patent of an immunity test)) discloses known technology of an immunity test.

Generally, most of waveforms applied to an electronic circuit are oscillating in the application methods of the related art. Therefore, a voltage actually applied to an electronic circuit cannot be defined. In many cases, an applied voltage is defined as a setting voltage of a voltage source at the time of application for convenience's sake. Specifically, even if a device could resist +4 kV with respect to a power source in an electrostatic test, for example, +4 kV was not actually applied to an electronic circuit in the device. Only a voltage about several times the power source voltage is applied, and a waveform oscillating in both of the positive direction and the negative direction with respect to the power source voltage is applied (FIG. 1).

In addition to the aforementioned device that charges a capacitor to apply the charge to an electronic circuit, a noise simulator as a device capable of generating a rectangular wave, an arbitrary waveform generator, and the like have been known as impulse sources. There has also been known a TLP (Transmission Line Pulse) generator used for testing a semiconductor protective element (see Patent Literature 2 (Japanese laid-open patent publication No. 2006-038542 (the example of a protective element test using a TLP generator))).

DISCLOSURE OF INVENTION

Problem(s) to be Solved by the Invention

The aforementioned application methods in the related art have a problem that they cannot clearly determine a level of a voltage actually applied to an electronic circuit. Particularly, when an impulse is applied to an electronic circuit, it is generally applied in the form of an oscillating waveform as shown in FIG. 1. Therefore, there is a problem that a peak value of noise inputted to an electronic circuit is not clear. Additionally, there is another problem that the direction of a noise, i.e., the positive direction or the negative direction, that caused an error cannot be specified.

The present invention provides an impulse immunity test apparatus capable of applying a rectangular wave in the positive and negative directions, irrespective of types of lines, such as a power source line, a ground line, and a signal line, to test an immunity of an electronic circuit.

Means to Solve the Problem(s)

According to the present invention, there is provided an impulse immunity test apparatus characterized by comprising an electronic circuit to be tested, a first electric line extending from the electronic circuit, an injection resistance inserted in series on the first electric line which forms an application probe portion, and a rectangular wave generator operable to apply a rectangular wave to the injection resistance, wherein a peak value, a pulse duration, and a rise time of the rectangular wave generated by the rectangular wave generator are varied to examine occurrence of an error when the set rectangular wave is applied to the electronic circuit.

Furthermore, according to the present invention, there is provided an impulse immunity test apparatus characterized by comprising an electronic circuit to be tested, a first electric line extending from the electronic circuit, an injection resistance inserted in series on the first electric line which forms an application probe portion, a rectangular wave generator operable to generate a rectangular wave, a transmission line for transmitting the rectangular wave generated by the rectangular wave generator, and a matching resistance connecting the transmission line and the injection resistance to each other, wherein the injection resistance is sufficiently lower than an output impedance of the rectangular wave generator, a characteristic impedance of the transmission line is substantially the same as the output impedance of the rectangular wave generator, and a sum of a value of the injection resistance in the application probe portion and a value of the matching resistance is substantially equal to the characteristic impedance of the transmission line.

Effect(s) of the Invention

According to the present invention, it is possible to obtain an impulse immunity test apparatus capable of applying a rectangular wave in the positive and negative directions, irrespective of types of lines, such as a power source line, a ground line, and a signal line, to test an immunity of an electronic circuit.

DESCRIPTION OF REFERENCE NUMERALS

Figure 1:
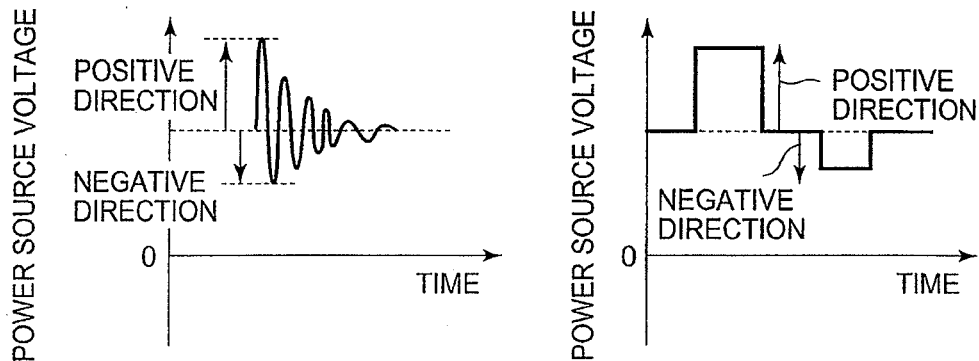
FIG. 1 is a diagram explanatory of problems of application methods in the related art.

1 Rectangular wave generator
2 Electronic circuit
3 Injection resistance
4 Matching resistance
5 Transmission line
6 Capacitor
7 Coaxial line
8 TLP generator
9 Monitor function
10 Error observation function
11 Connector joint
12 Connector joint 2
13 Capacitor 2

BEST MODE FOR CARRYING OUT THE INVENTION

Next, embodiments of the present invention will be described below with reference to the drawings.

Features of the Present Invention

Embodiments of the present invention have features in that a rectangular wave can be applied to an electronic circuit. A rectangular wave can be generated by a noise simulator or an arbitrary waveform generator. The rectangular wave is applied to a target electronic circuit in such a state that disturbance of the waveform is minimized by using a transmission line such as a coaxial line. Furthermore, a rectangular wave can be applied to any electric line irrespective of types of lines, such as a power source line, a ground line, and a signal line.

[Configurations]

Specifically, the following are Configurations 1 to 16 of an impulse immunity test apparatus according to embodiments of the present invention.

Figure 2:
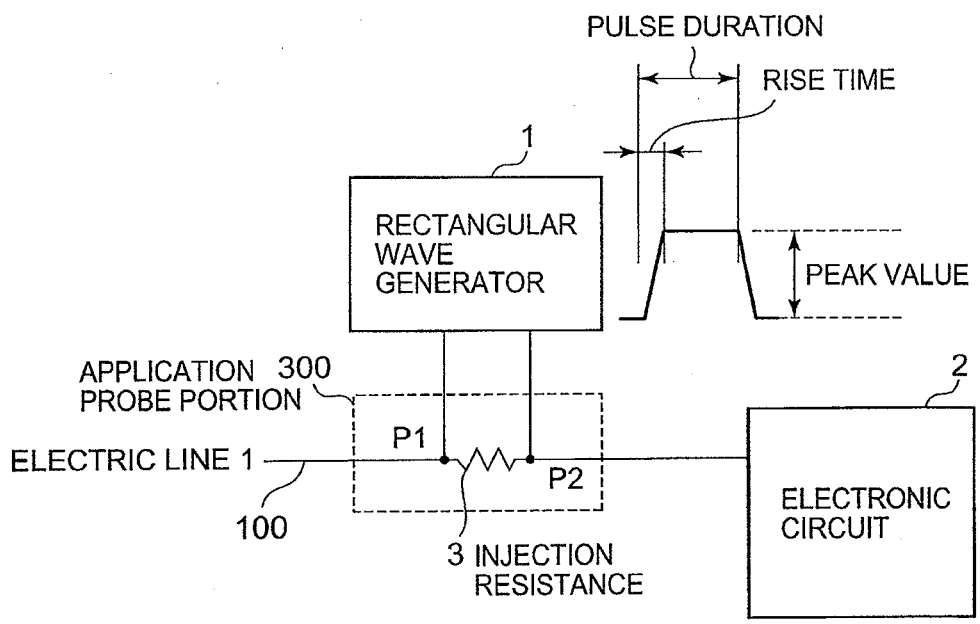
FIG. 2 is a diagram explanatory of an embodiment (Configuration 1) of the present invention.

(Configuration 1) An impulse immunity test apparatus, as shown in FIG. 2, characterized by comprising an electronic circuit 2 to be tested, an electric line 1 (100) extending from the electronic circuit 2, an injection resistance 3 inserted in series on the electric line 1 (100) which forms an application probe portion (300), and a rectangular wave generator 1 operable to apply a rectangular wave to the injection resistance 3, wherein a peak value, a pulse duration, and a rise time of the rectangular wave generated by the rectangular wave generator 1 are varied to examine occurrence of an error when the set rectangular wave is applied to the electronic circuit 2.

Figure 3:
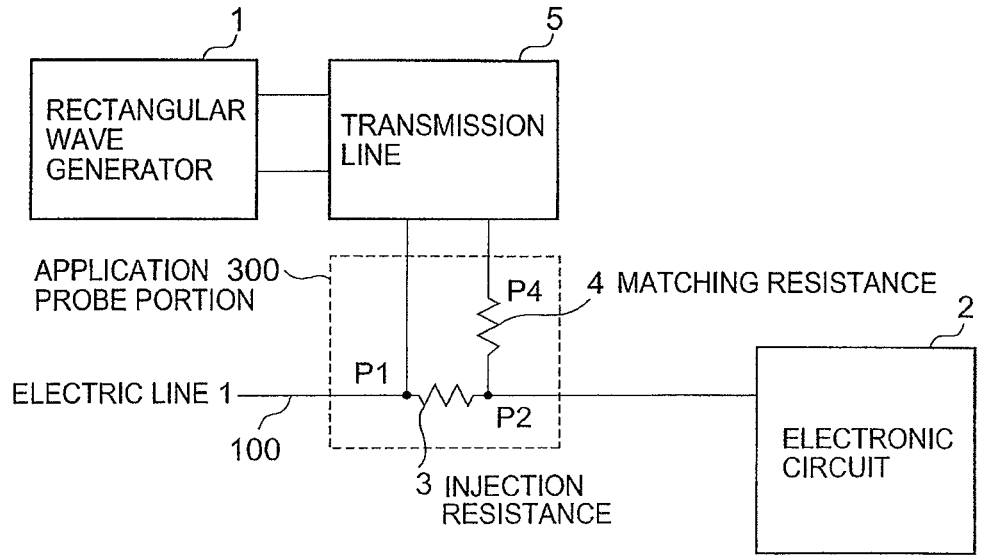
FIG. 3 is a diagram explanatory of an embodiment (Configuration 2) of the present invention.

(Configuration 2) An impulse immunity test apparatus, as shown in FIG. 3, characterized by comprising an electronic circuit 2 to be tested, an electric line 1 (100) extending from the electronic circuit 2, an injection resistance 3 inserted in series on the electric line 1 (100) which forms an application probe portion (300), a rectangular wave generator 1 operable to generate a rectangular wave, a transmission line 5 for transmitting the rectangular wave generated by the rectangular wave generator 1, and a matching resistance 4 connecting the transmission line 5 and the injection resistance 3 to each other, wherein the injection resistance 3 is sufficiently lower than an output impedance of the rectangular wave generator 1, a characteristic impedance of the transmission line 5 is substantially the same as the output impedance of the rectangular wave generator 1, and a sum of a value of the injection resistance of the application probe portion (300) and a value of the matching resistance is substantially equal to the characteristic impedance of the transmission line 5.

Figure 4:
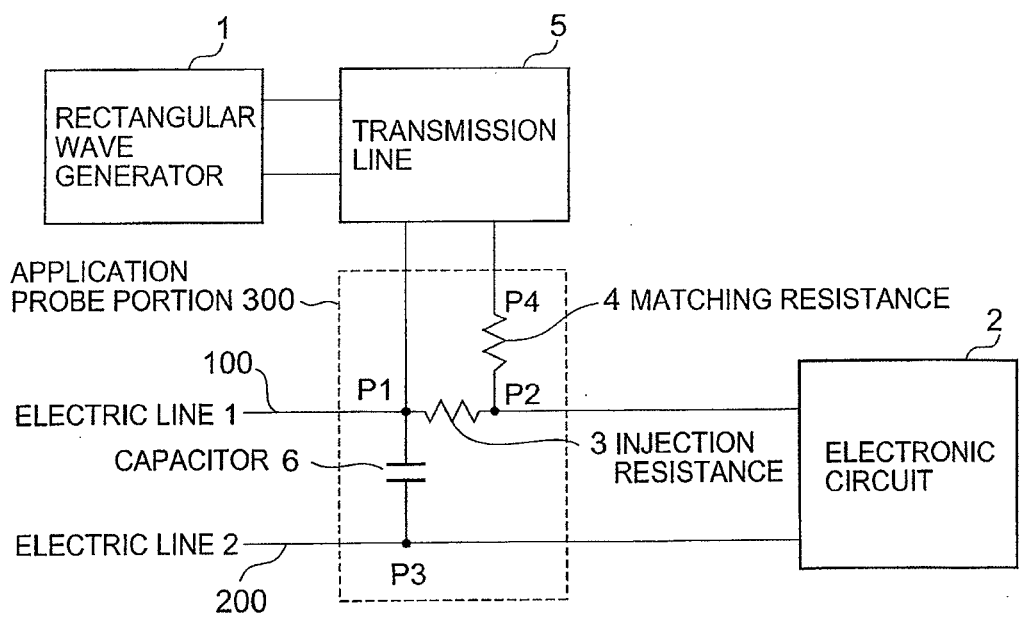
FIG. 4 is a diagram explanatory of an embodiment (Configuration 3) of the present invention.

(Configuration 3) The impulse immunity test apparatus in Configuration 1 or 2, as shown in FIG. 4, characterized in that
    an electric line 2 (200) extends from the electronic circuit 2 to be tested in addition to the electric line 1 (100),
    the application probe portion (300) is formed by the injection resistance 3 in series on the electric line 1 (100) and a capacitor 6 connected between the electric line 1 (100) and the electric line 2 (200) with a terminal P1 and a terminal P3, and a connected position of the capacitor 6 to the electric line 1 (100) is located at the terminal P1 of the injection resistance 3 which is located away from the electronic circuit 2, or
    the application probe portion (300) is formed by
        the injection resistance 3 in series on the electric line 1 (100),
        a capacitor 6 connected between the electric line 1 (100) and the electric line 2 (200) with a terminal P1 and a terminal P3, the capacitor 6 having an end connected to the terminal P1 of the injection resistance 3 which is located away from the electronic circuit, and
        a matching resistance 4 connected between the rectangular wave generator 1 and the injection resistance 3 or between the transmission line 5 and the injection resistance 3 with a terminal P4 and a terminal P2, and
    an inner conductor and an outer conductor of a coaxial line are connected to both ends of the resistance.

Figure 5:
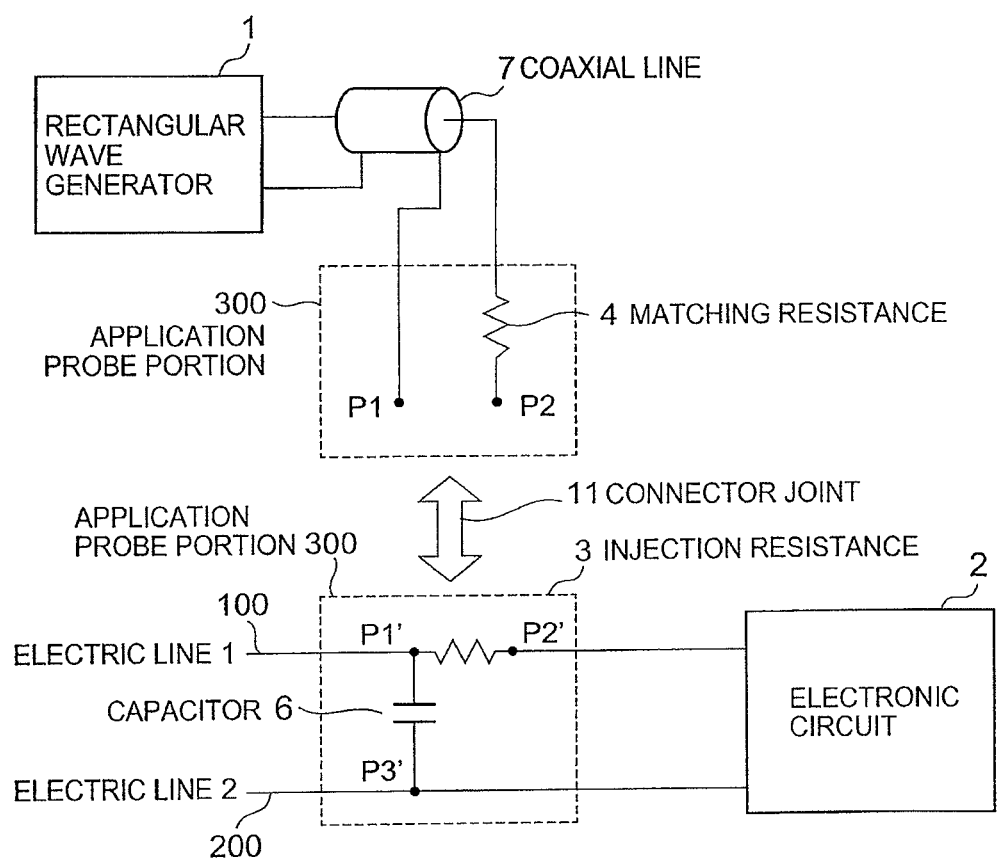
FIG. 5 is a diagram explanatory of an embodiment (Configuration 4) of the present invention.

(Configuration 4) The impulse immunity test apparatus in Configuration 2 or 3, as shown in FIG. 5, characterized in that the transmission line 5 comprises a coaxial line 7, only the matching resistance 4 is connected to an end of a central conductor of the coaxial line 7, another end P2 of the matching resistance 4 and an end P1 of an outer conductor form a connector joint with both ends P1' and P2' of the injection resistance 3 for the electronic circuit 2 to be tested (the opposed terminals P1 and P1' are connected to each other, and the opposed terminals P2 and P2' are connected to each other).

Figure 6:
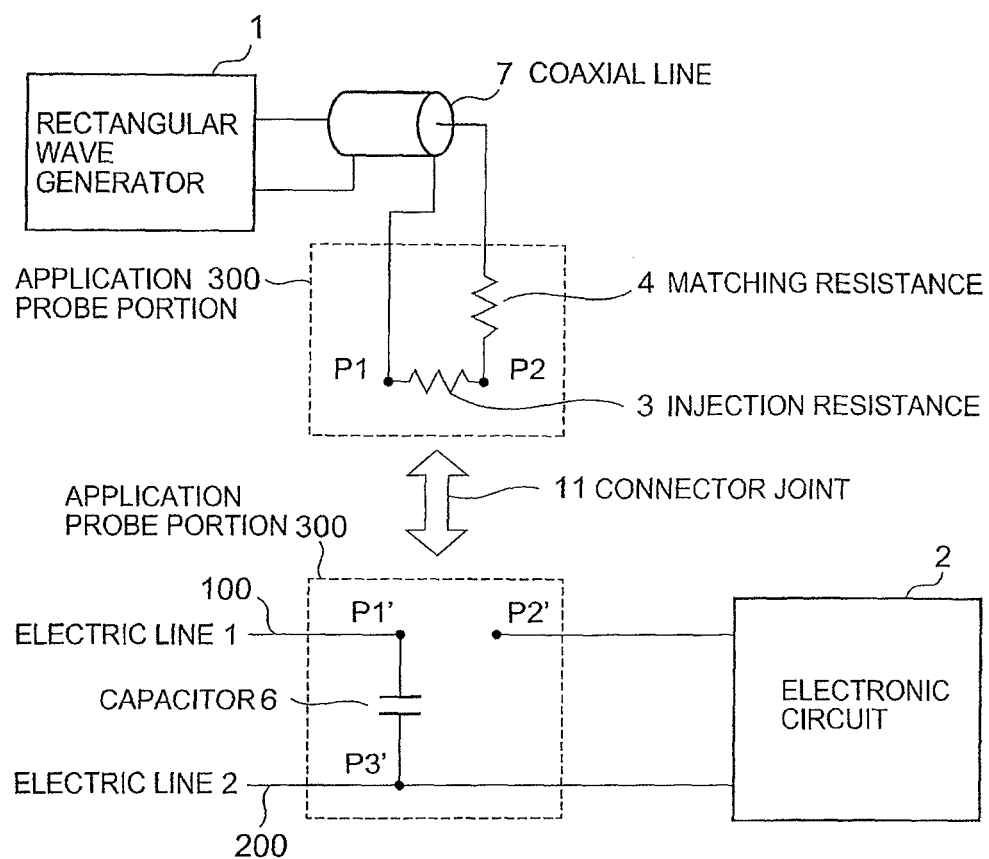
FIG. 6 is a diagram explanatory of an embodiment (Configuration 5) of the present invention.

(Configuration 5) The impulse immunity test apparatus in Configuration 2 or 3, as shown in FIG. 6, characterized in that
the transmission line 5 comprises a coaxial line 7,
an end of the matching resistance 4 is connected to an end of a central conductor of the coaxial line 7,
another end of the matching resistance 4 is connected to an end P2 of the injection resistance 3,
another end P1 of the injection resistance 3 is connected to an outer conductor of the coaxial line 7,
the electric line 1 (100) of the electronic circuit 2 to be subjected to application is cut so as to have opposite ends P1' and P2', and
both ends P1 and P2 of the injection resistance 3 form a connector joint with the two pin terminals P1' and P2' of the electric line 1 (100) opposed to the injection resistance 3 (the opposed terminals P1 and P1' are connected to each other, and the opposed terminals P2 and P2' are connected to each other).

Figure 7:
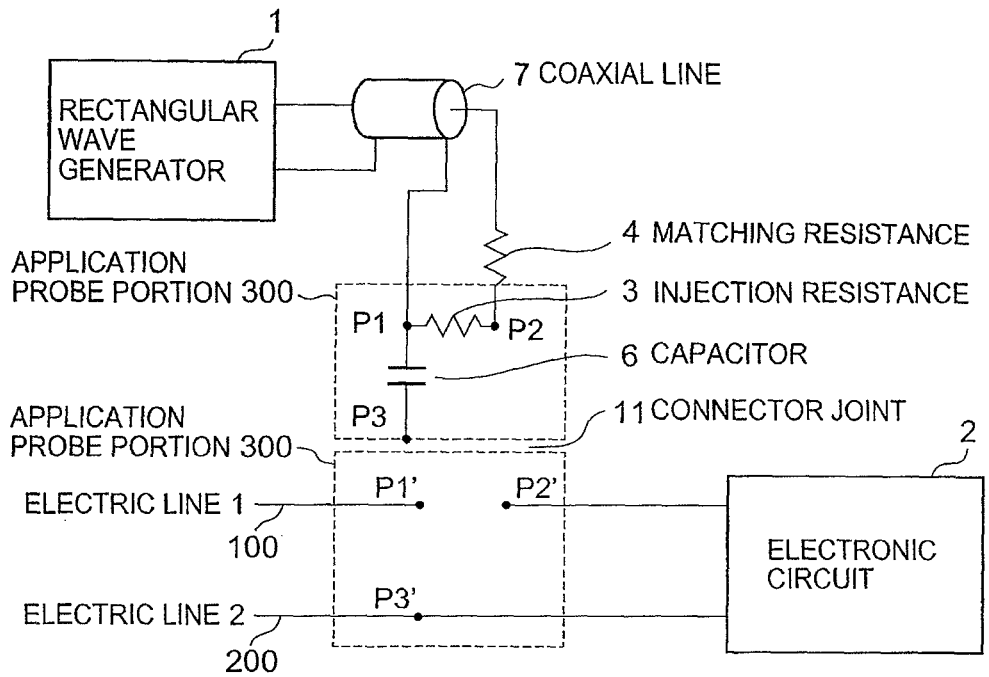
FIG. 7 is a diagram explanatory of an embodiment (Configuration 6) of the present invention.

(Configuration 6) The impulse immunity test apparatus in Configuration 2 or 3, as shown in FIG. 7, characterized in that
the transmission line comprises a coaxial line,
an end of the matching resistance 4 is connected to an end of a central conductor of the coaxial line 7,
another end P2 of the matching resistance 4 is connected to an end of the injection resistance 3,
another end P1 of the injection resistance 3 is connected to an outer conductor of the coaxial line 7,
an end of a capacitor 6 is connected to P1, the capacitor having another end P3,
the electric line 1 (100) extending from the electronic circuit 2 to be subjected to application is cut so as to have an end P2' nearer to the electronic circuit 2 and another end P1',
a terminal P3' is provided on the electric line extending from the electronic circuit 2, and
the terminals P1, P2, and P3 on a side of the coaxial line 7 form a connector joint with the terminals P1', P2', and P3' of the electric line 1 (100) and the electric line 2 (200) opposed to the coaxial line 7 (the opposed terminals P1 and P1' are connected to each other, the opposed terminals P2 and P2' are connected to each other, and the opposed terminals P3 and P3' are connected to each other).

Figure 8:
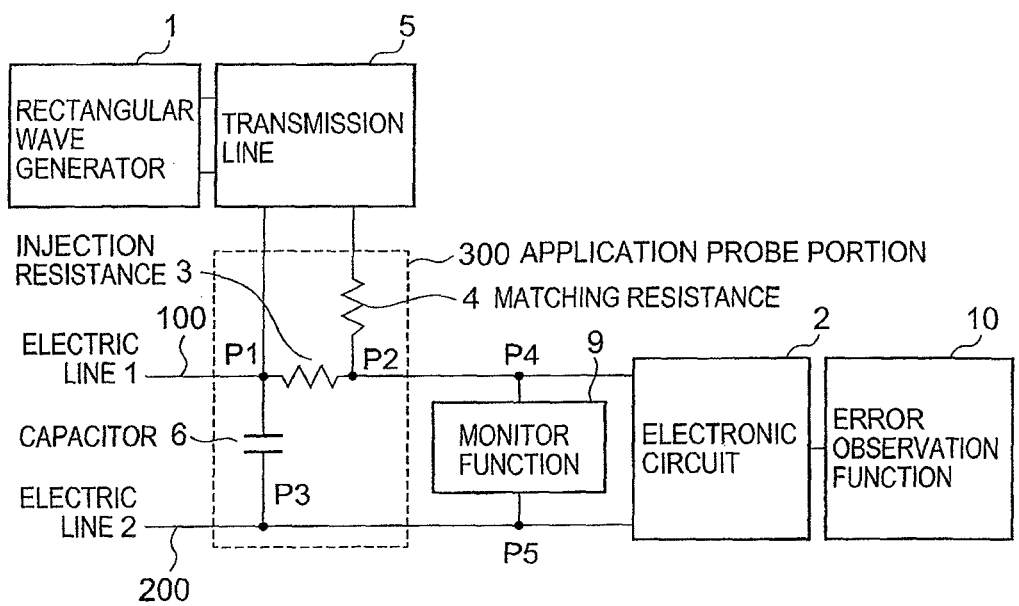
FIG. 8 is a diagram explanatory of an embodiment (Configuration 7) of the present invention.

(Configuration 7) The impulse immunity test apparatus in any one of Configurations 1 to 6, as shown in FIG. 8, characterized by comprising:
a monitor function 9 of monitoring an application waveform,
the monitor function 9 being disposed between the electric line 1 (100) and the electric line 2 (200) and between the injection resistance 3, the capacitor 6, P2', or P3' and the electronic circuit 2; and
an error observation function 10 of monitoring an error of the electronic circuit 2.

Figure 9:
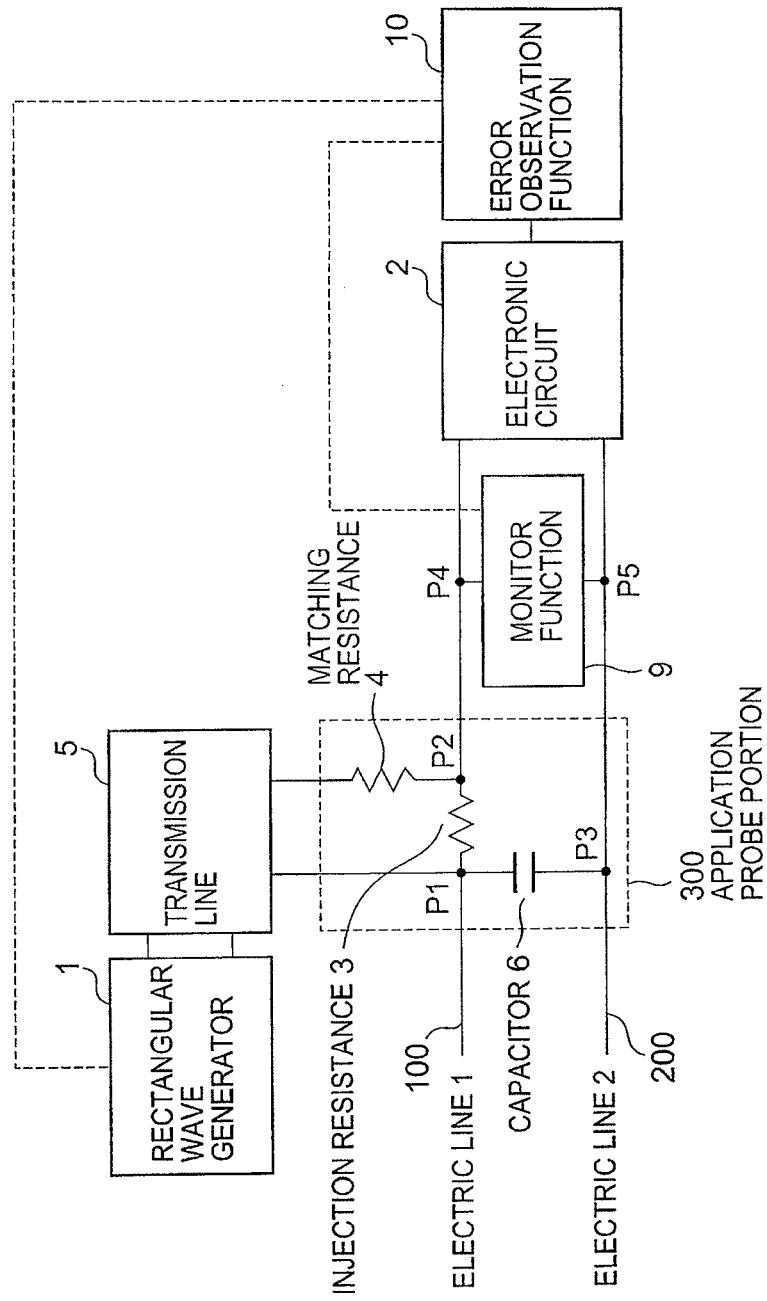
FIG. 9 is a diagram explanatory of an embodiment (Configuration 8) of the present invention.
Figure 10:
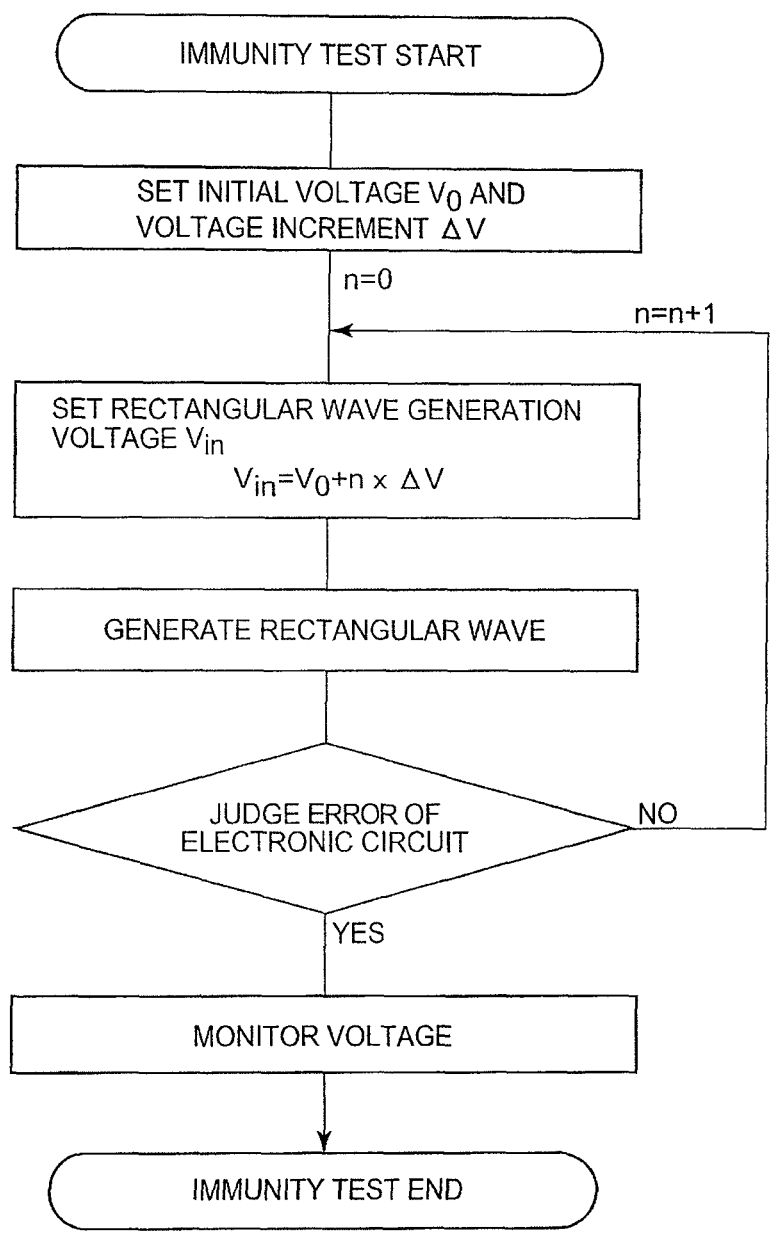
FIG. 10 is a diagram explanatory of the embodiment (Configuration 8) of the present invention.

(Configuration 8) The impulse immunity test apparatus in Configuration 7, as shown in FIG. 9, characterized in that
the error observation function 10 has functions of setting an application voltage, timing an application, and monitoring an error of the monitor function 9 and the electronic circuit 2 during the application (FIG. 10).

Figure 11:
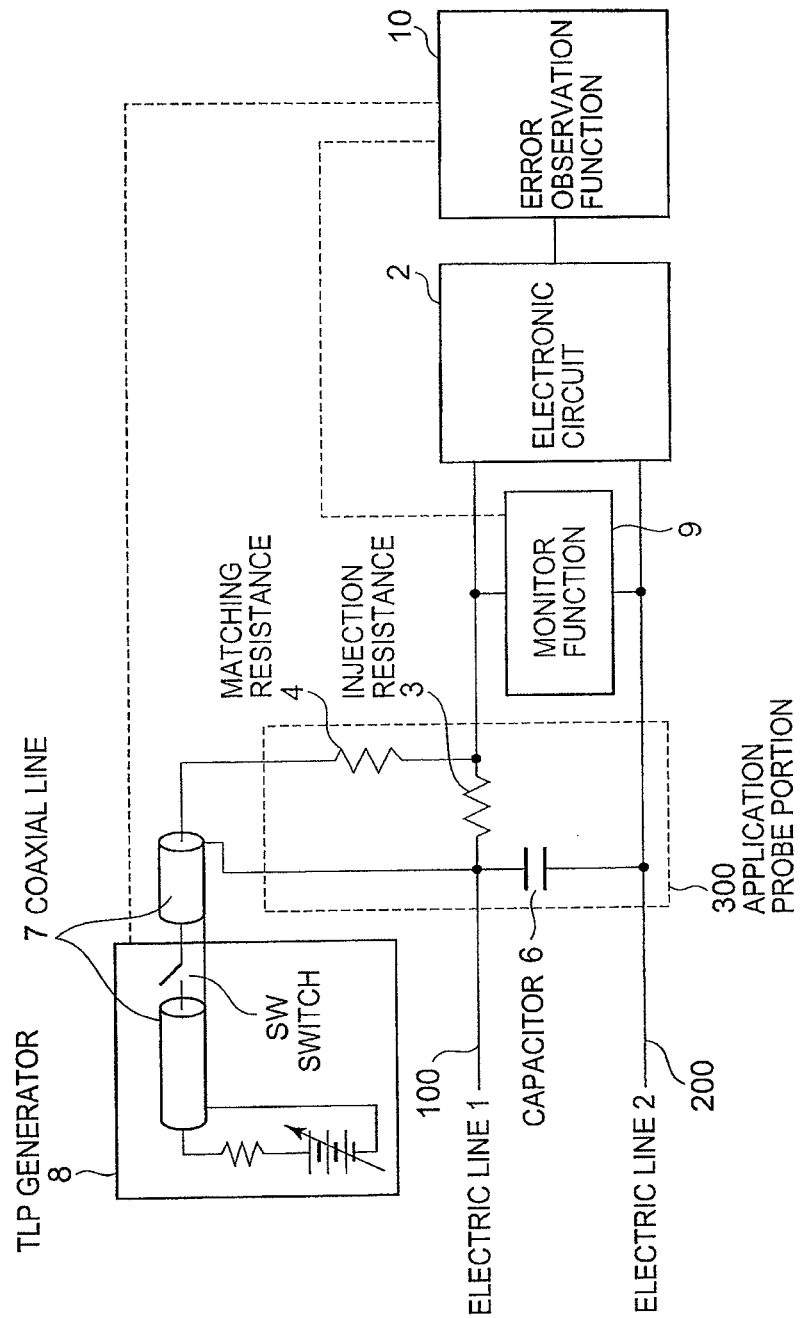
FIG. 11 is a diagram explanatory of an embodiment (Configuration 9) of the present invention.

(Configuration 9) The impulse immunity test apparatus in any one of Configurations 1 to 8, as shown in FIG. 11, characterized in that
the rectangular wave generator 1 comprises a TLP (Transmission Line Pulse) generator 8 for applying electric charges accumulated in the coaxial line 7.

Figure 12:
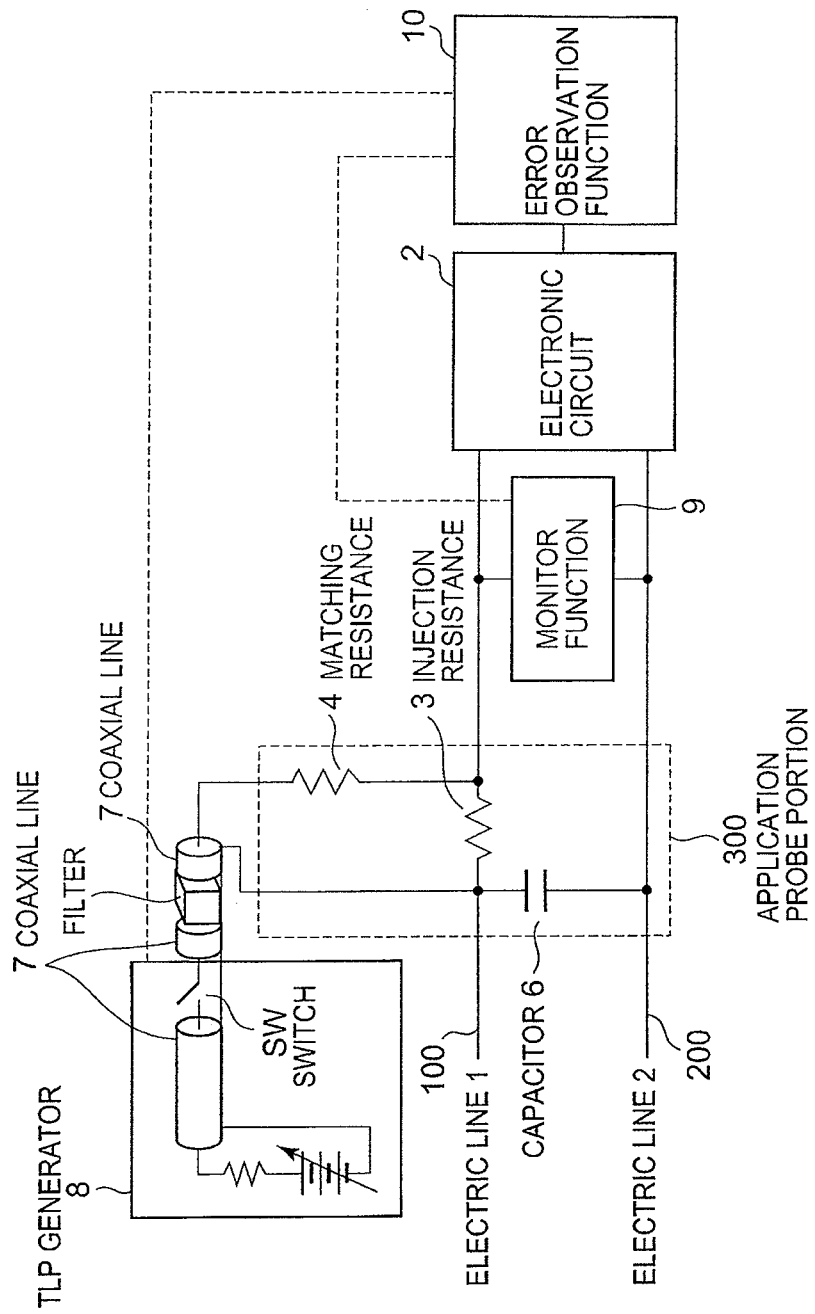
FIG. 12 is a diagram explanatory of an embodiment (Configuration 10) of the present invention.

(Configuration 10) The impulse immunity test apparatus in Configuration 9, as shown in FIG. 12, characterized in that
a filter for correcting a rise time is inserted in the coaxial line 7 connected to the TLP generator 8.

Figure 13:
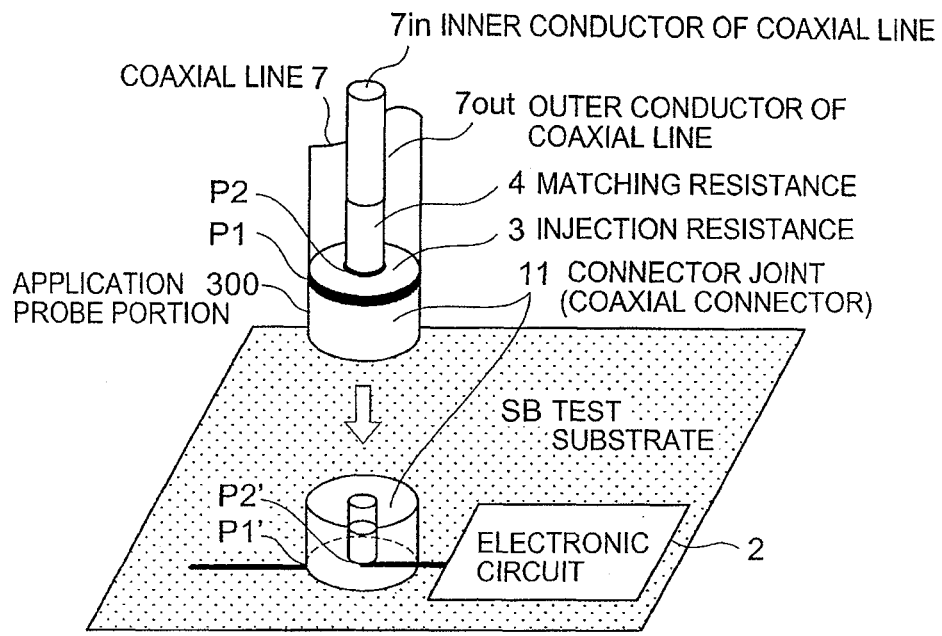
FIG. 13 is a diagram explanatory of an embodiment (Configuration 11) of the present invention.

(Configuration 11) The impulse immunity test apparatus in Configuration 5, as shown in FIG. 13, characterized in that
the injection resistance 3 comprises an annular disk resistor,
the matching resistance 4 comprises a chip resistor or a cylindrical resistor,
the connector comprises a coaxial connector 11,
a terminal of the matching resistance 4 is connected to a tip of an inner conductor of the coaxial line 7,
another terminal P2 of the matching resistance 4 is connected to a subcentral terminal of the disk resistor 3,
the outer terminal P1 of the disk resistor 3 is connected to an outer conductor of the coaxial line 7,
the subcentral terminal P2 of the injection resistance 3 is connected to a central conductor of the coaxial connector 11, and
the outer terminal P1 of the injection resistance 3 is connected to an outer conductor of the coaxial connector 11.

Figure 14:
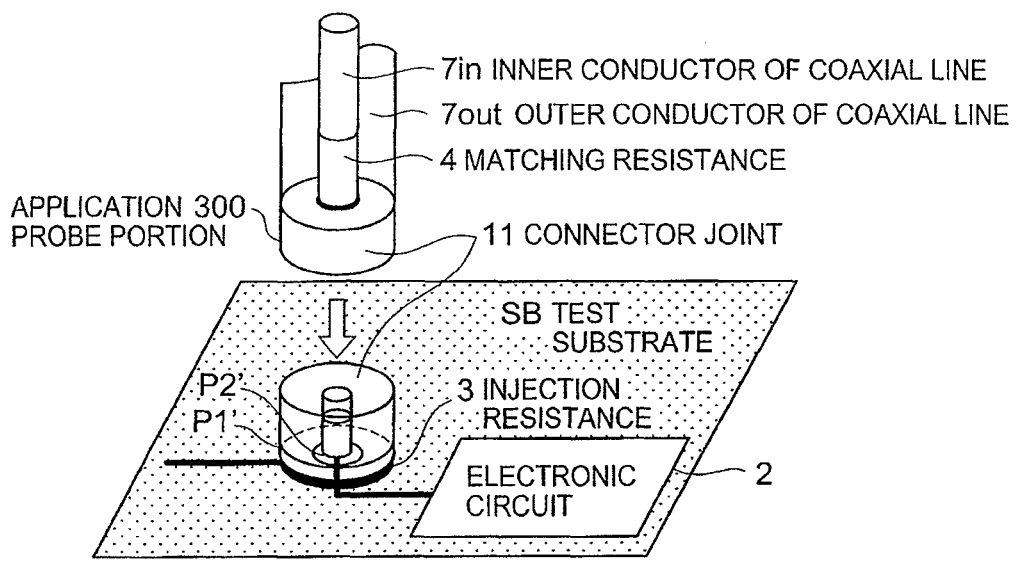
FIG. 14 is a diagram explanatory of an embodiment (Configuration 12) of the present invention.

(Configuration 12) The impulse immunity test apparatus in Configuration 5, as shown in FIG. 14, characterized in that
the injection resistance 3 comprises an annular disk resistor,
the matching resistance 4 comprises a chip resistor or a cylindrical resistor,
the connector 11 comprises a coaxial connector 11,
a terminal of the matching resistance 4 is connected to a tip of an inner conductor of the coaxial line,
another terminal P2 of the matching resistance 4 is connected to an inner conductor of the coaxial connector 11,
an outer conductor of the coaxial line is connected to an outer conductor of the coaxial connector 11,
the disk resistor 3 is arranged in series on the electric line 1 (100),
the subcentral terminal P2' of the disk resistor 3 is connected to a central conductor of the coaxial connector 11 as a receiver, and
the outer terminal P1' of the disk resistor 3 is connected to an outer conductor of the coaxial connector 11.

Figure 15:
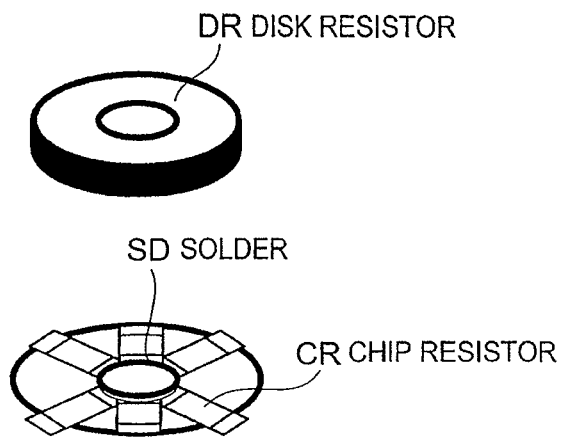
FIG. 15 is a diagram explanatory of an embodiment (Configuration 13) of the present invention.

(Configuration 13) The impulse immunity test apparatus in any one of Configurations 1 to 6, 11, and 12, as shown in FIG. 15, characterized in that
the injection resistance 3 comprises a plurality of chip resistors arranged radially with one end directed inward instead of an annular disk resistor, and
inner ends and outer ends of the chip resistors are respectively connected to each other in a circular form.

Figure 16:
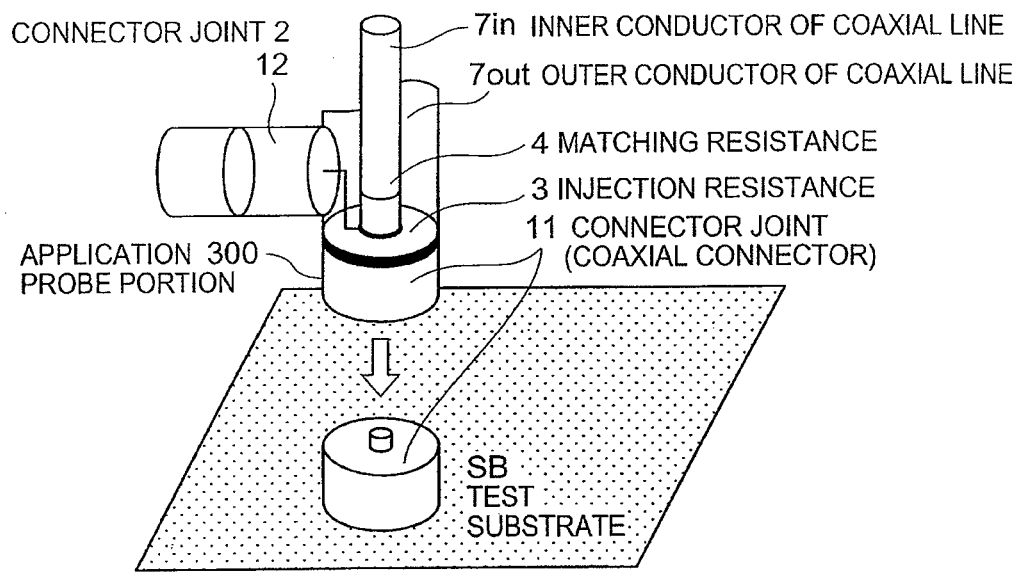
FIG. 16 is a diagram explanatory of an embodiment (Configuration 14) of the present invention.

(Configuration 14) The impulse immunity test apparatus in any one of Configurations 1 to 6 and 11 to 13, as shown in FIG. 16, characterized in that
the application probe portion (300) includes a second coaxial connector 2 (12),
the terminal P2 of the injection resistance 3 and an inner conductor of the coaxial connector 2 (12) are connected to each other, and
the terminal P1 of the application terminal 3 and an outer conductor of the coaxial connector 2 (12) are connected to each other.

Figure 17:
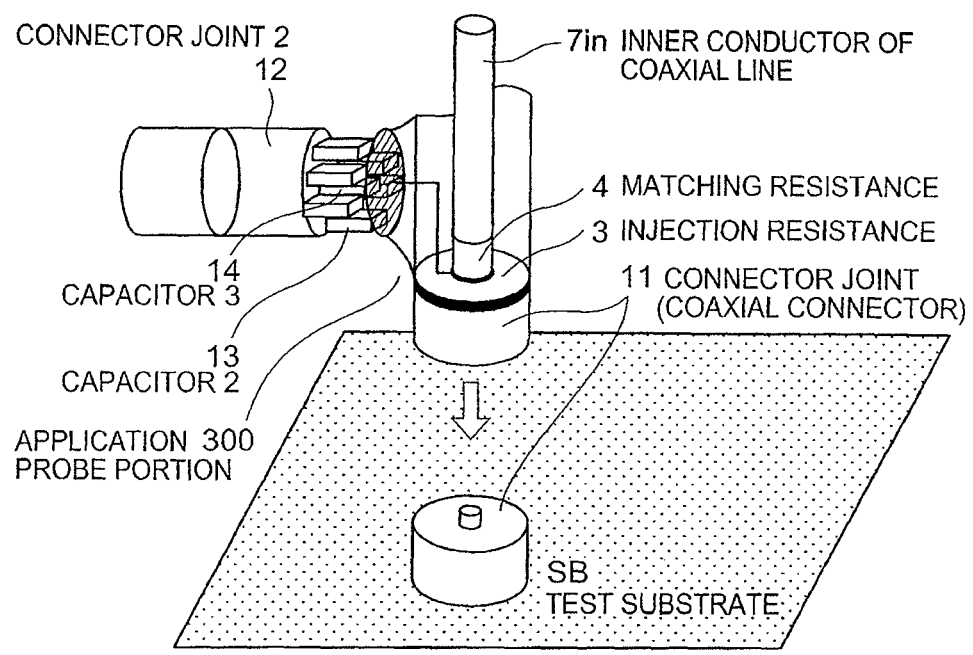
FIG. 17 is a diagram explanatory of an embodiment (Configuration 15) of the present invention.

(Configuration 15) The impulse immunity test apparatus in any one of Configurations 1 to 6, 11, 12, and 14, as shown in FIG. 17, characterized in that
    a capacitor 2 (13) is connected to the terminal P2 of the injection resistance 3,
    another end of the capacitor 2 (13) is connected to an inner conductor of the coaxial connector 2 (12),
    a plurality of capacitors 3 (14) are arranged in a cylindrical form at equal intervals and connected to the P1 terminal of the injection resistance 3, and
    another end of each capacitor 3 (14) is connected to an outer conductor of the coaxial connector 2 (12).

Figure 18:
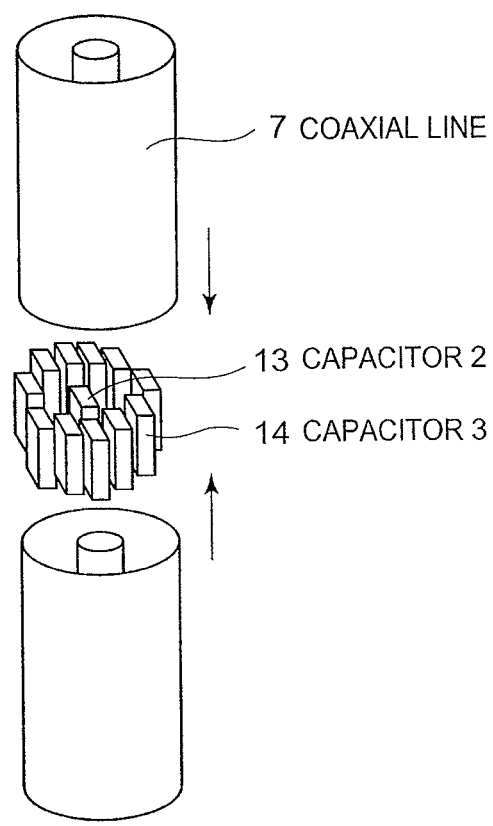
FIG. 18 is a diagram explanatory of an embodiment (Configuration 16) of the present invention.

(Configuration 16) The impulse immunity test apparatus in Configuration 7 or 8, as shown in FIG. 18, characterized by comprising:
    a coaxial line 7 connecting P4 and P5 of the electric line 1 (100) and the electric line 2 (200) to the monitor function,
        the coaxial line 7 having a structure
            in which inner conductors are connected to each other in the shortest distance by a capacitor 2 (13), and
            outer conductors are connected to each other in the shortest distance by a plurality of capacitors 3 (14) arranged in a cylindrical form at equal intervals.

[Principles]

Specifically, according to an embodiment of the present invention, a resistance to such a degree that an operation of a circuit is not disturbed (about 0.05Ω to about 50Ω) is inserted in series with an electric line 1 (100) of an electronic circuit to be subjected to application in order to implement the aforementioned features. Outputs of a rectangular wave generator are connected to both ends of the injection resistance (FIG. 2). Practically, the rectangular wave refers to a trapezoidal wave (because it is impractical that the rise time is zero second). In a case where an upper base of the trapezoid is zero, the rectangular wave becomes a triangular wave. A trapezoidal wave is generally represented by parameters such as a peak value, a pulse duration, and a rise time (fall time). A pulse duration may refer to a half-width of the pulse. Nevertheless, in the description of the present invention, a pulse duration refers to the sum of a rise time and a flat region corresponding to an upper base of the trapezoid as shown in FIG. 2.

If a rectangular wave generated very close to the injection resistance by a rectangular wave generator is to be applied in such an ideal state that an output impedance of the rectangular wave generator is 0Ω, the rectangular wave can be applied by the test system as shown in FIG. 2.

However, an output impedance of the rectangular wave generator is not 0Ω in practical use. For example, if an output impedance of the rectangular wave generator is 50Ω, then it is necessary to connect the rectangular wave generator to the injection resistance by a transmission line such as a coaxial line having the same characteristic impedance in order to apply the rectangular wave such that disturbance of the waveform is minimized. The injection resistance is also required to have the same value as the characteristic impedance.

However, if the injection resistance is 50Ω, for example, a voltage drop of about 0.5 V is generated at the maximum in a case where the electronic circuit has a maximum current of about 10 mA. Therefore, such a system is not suitable for testing an electronic circuit operable at a low power source voltage. Accordingly, it is necessary to use an injection resistance having a low resistance (about 0.1Ω to about 1Ω) that has little influence on the operation of the electronic circuit. In order to match the characteristic impedance of the transmission line under those conditions, this impulse immunity test apparatus uses such values that (the injection resistance+the matching resistance=the characteristic impedance of the transmission line) (FIG. 3).

There have been illustrated so far the cases where a rectangular wave is applied to one specific electric line.

Next, it is assumed that an electric line 2 (200) is provided as a return of the applied rectangular wave with respect to the electric line 1 (100) to which the rectangular wave is applied (FIG. 4). If the electric line 1 (100) and the electric line 2 (200) are connected on an opposite side of the electronic circuit as viewed from the injection resistance, then there can be formed a closed circuit of the electronic circuit→the electric line 1→the injection resistance→the electric line 1→the electric line 2→the electronic circuit. Thus, a rectangular wave can be applied within the closed circuit. However, if the electric line 1 (100) and the electric line 2 (200) are directly connected to each other, the electronic circuit may not operate correctly in some cases. Particularly, when the electric line 1 (100) and the electric line 2 (200) are used for the power source and the ground, they cannot be directly connected to each other in a direct current scheme. Therefore, a capacitor 6 is inserted in order to sufficiently transmit the rectangular wave and cut a direct current (FIG. 4).

There has been illustrated a method of applying noise to the target electronic circuit.

In the cases where the matching resistance and the injection resistance are provided on a test substrate on which the electronic circuit to be tested is mounted (FIGS. 4 and 5), a high-voltage pulse generated by a high-voltage generator, such as a TLP, is applied to the substrate via a connector. Therefore, the connector is required to handle a high voltage so that internal discharge is unlikely to occur. Furthermore, it is necessary to consider a pattern of the matching resistance and the injection resistance on the test substrate. That is, it is necessary to improve high-frequency characteristics by arranging chip resistors radially in parallel or using an annular or disk resistor.

In practical tests, there may be a plurality of electric lines to be tested by applying noise thereto. It is not efficient that a plurality of rectangular wave generators are provided for those electric lines. Therefore, a connector structure is used such that one rectangular wave generator can apply noise to a plurality of electric lines. The following configuration is used from the viewpoint of the stability and the safety.

A probe portion is provided at a tip of the transmission line, i.e., the coaxial line. The injection resistance is provided on the probe (FIG. 5). Alternatively, both of the injection resistance and the capacitor for a return from another line are provided on the probe (FIG. 6). A connector structure is used to connect the electric line 1 (100) and the probe portion to each other. A connector for a short circuit is connected when no noise is applied to the electric line 1 (100). Merits of use of this structure are as follows: Since the injection resistance is provided on the probe, even if a TLP generator (described later) having a high-voltage source is used as the rectangular wave generator, there is less fear that one receives an electric shock from unnecessary electric charges accumulated on a cable at the moment when touching a cable while the probe is not connected. Furthermore, there would be less fear of similar accidents if a switch of the TLP generator should be turned on by mistake. Moreover, for a second reason, since the same injection resistance or the same combination of the matching resistance and the injection resistance for matching can be used for any electric line, stable application with less variation can be achieved as compared to cases where the injection resistance or the capacitor is provided on the electric line. The capacitor may not necessarily be provided in FIGS. 5 and 6.

Next, components of immunity test and test algorithm will be described.

FIG. 7 shows an example in which the aforementioned generator and application portion are used with a monitor function of monitoring a voltage applied to the electronic circuit to be tested and an error observation function of monitoring an error of the electronic circuit as components necessary for the test.

Furthermore, FIG. 8 shows an example in which the block of the error observation function serves to monitor the entire immunity test. In FIG. 9, the error observation function sets an application voltage of the rectangular wave generator and controls the timing of the application. At the same time, the monitor function monitors a voltage applied between the electric lines and examines whether an error occurs in the electronic circuit as a result of application of the rectangular wave. FIG. 10 shows the algorithm for immunity test used at that time. The application voltage is gradually increased from $V_0$ by $\Delta V$. When an error is observed for the first time, a voltage between both ends of the injection resistance or a voltage between the electric line 1 and the electric line 2 which is obtained by the voltage monitor is defined as an immunity under those conditions.

When an arbitrary waveform generator is used as the rectangular wave generator in an immunity test according to the present invention, it may be unable to apply noise sufficient to cause an error. For example, most of general arbitrary waveform generators are formed by a semiconductor circuit. Generally, an arbitrary waveform generator having a rise time of about 1 ns has a voltage amplitude of about ±10 V or so at the maximum. As described above, in order to apply a rectangular wave by this application system with the output impedance of 50Ω, the transmission line of 50Ω, the injection resistance of 1Ω, and the matching resistance of 49Ω, for example, the application voltage becomes 1/(50+50) of the voltage source. Therefore, when a rectangular wave having a peak value of 10 V is generated by the rectangular wave generator, a rectangular wave having a peak value of 0.1 V is applied to the electric line of the electronic circuit. In most of cases where the electronic circuit operates at a power source voltage of 1.5 V to 3 V in actual use, the rectangular wave having a peak value of 0.1 V is insufficient to cause an error. Assuming that a voltage actually applied should be about two times an operation voltage of the electronic circuit, a high-voltage source of about 700 V is needed if a voltage slightly less than 7 V is applied to an electronic circuit that operates at a power source voltage of 3.3 V. Thus, in order to implement such a high-voltage source with a rise time of about 1 ns, a rectangular wave generator having a TLP (Transmission Line Pulse) system is used. As shown in FIG. 11, this generator accumulates electric charges of a high voltage in a coaxial line and applies them to a resistance having a matching terminal of the coaxial line having the same characteristic impedance. This generator can readily implement a rectangular wave having a peak value of several kilovolts and a rise time of 1 ns or less. The pulse duration is controlled by an electrical length of the coaxial line located closer to the high-voltage power source than a switch SW.

Furthermore, as shown in FIG. 12, a filter for controlling the rise characteristics can be loaded within the coaxial line, thereby achieving control for slowing the rise time down.

For a specific shape of the application probe portion (300), when the matching resistance and the injection resistance are provided, as shown FIGS. 21 to 25, on the electric line 1 (100) of a test substrate on which an electronic circuit is mounted (FIGS. 2 to 5), the application probe portion may be a mere connector. A plurality of chip resistors are connected radially in parallel on the test substrate at the possible closest positions to a connector portion at which the coaxial line for applying a pulse waveform is connected to the test substrate. Alternatively, the matching resistance and the injection resistance are formed by an annular or disk resistor.

When the injection resistance is arranged within the probe portion having a connector joint with the test substrate as shown in FIGS. 6 and 7, this structure, i.e., the matching resistance and the injection resistance should be incorporated in a tip of the coaxial line. Therefore, as shown in FIG. 13, a cylindrical or chip resistor is connected to an inner conductor 7 in of the coaxial line. A tip of the cylindrical or chip resistor is connected to a subcentral terminal P2 of an annular disk resistor. Furthermore, an outer conductor 7 out of the coaxial line is connected to an outer terminal P1 of the disk resistor. When the diameter of the disk resistor is substantially the same as the diameter of the outer conductor 7 out of the coaxial line under conditions that (the matching resistance+ the injection resistance=the characteristic impedance of the cable), the reflection in the application probe portion (300) can be minimized to thereby apply a rectangular wave having less noise components.

Meanwhile, when a disk resistor is arranged on the test substrate SB as shown in FIG. 14, the disk resistor may be located on the test substrate SB right below the coaxial connector of the application probe portion (300), instead of the aforementioned arrangement of the chip resistors on the electric line 1 (100).

Instead of use of the disk resistor DR, as shown in FIG. 15, chip resistors CR may be arranged radially in such a state that inner portions and outer portions are electrically connected to each other, respectively, by solder SD.

In this system, a coaxial connector for monitoring an application voltage can be connected to an application probe portion (300) for application. As shown in FIG. 16, an inner terminal of the disk resistor or the radially arranged resistors is connected to the inner conductor of the coaxial connector 2. An outer terminal is connected to the outer conductor of the coaxial connector 2. Thus, the coaxial connector 2 is used as a connector for monitoring. This coaxial connector 2 can be connected to an oscilloscope or the like so as to monitor a rectangular wave applied to the injection resistance.

In FIG. 17, an inner terminal of the disk resistor or the radially arranged resistors is connected via a capacitor 2 to the inner conductor of the coaxial line for monitoring as with FIG. 16. Furthermore, an outer conductor is connected via capacitors 3 to the outer conductor of the coaxial line for monitoring. Since both of the inner conductor and the outer conductor are connected via the capacitors, the measuring device and the TLP generator can be separated from each other, and the ground of the test substrate SB can also be separated. Furthermore, the oscilloscope can be provided with input protection against leakage of DC components.

Similarly in FIG. 18, for the purposes of ground separation and DC cut, a capacitor 2 and capacitors 3 are inserted in the middle of the inner conductor and the ground of the coaxial line that connects the terminals P4 and P5 of the electric lines 1 and 2 to the monitor function shown in FIGS. 8, 10, and 11. Particularly, as shown in FIG. 18, a plurality of capacitors, rather than one chip capacitor, are arranged uniformly for the ground throughout the coaxial line.

[Effects]

With use of an impulse immunity apparatus according to embodiments of the present invention, a rectangular wave (trapezoidal wave), rather than a damped oscillation waveform, can be applied to an LSI. Furthermore, a rectangular wave according to the present invention can be applied not only to a power source and a signal line, but also to a ground line.

Furthermore, with use of a TLP generator as a rectangular wave generator, a rectangular wave having an amplitude sufficient to cause an error can be applied to an electronic circuit that operates at a general power source voltage of several volts. When a rectangular wave is applied to an LSI, a substantial immunity of the circuit, which could not be examined by conventional application of oscillating waveforms, can be tested. Additionally, analysis of error factors can be made and utilized to improve the immunity.

EXAMPLES

An example of the present invention will be described below with reference to FIG. 19. A TLP generator is used as a rectangular wave generator. Electric charges accumulated in a coaxial line are transmitted through a coaxial line having the same characteristic impedance as the TLP generator and applied to an application probe portion (300).

Generally, the rise time of a rectangular wave generated by a TLP generator can readily be adjusted to 1 ns or less. Conversely, the rise time may need to be adjusted to increase in some cases. Use of a filter FL can provide a rise time of 2 ns to 100 ns and a rise time longer than 100 ns under certain circumstances.

The application probe portion (300) is implemented by a matching resistance of 49Ω and an injection resistance of 1Ω, which match the characteristic impedances of 50Ω in the TLP generator and the coaxial line. Because a coaxial line having a characteristic impedance of 50Ω is generally used, a value of the matching resistance is determined by (the matching resistance value=the characteristic impedance value−the injection resistance value). However, when the TLP generator and the coaxial line are formed by a coaxial line having a characteristic impedance lower than 50Ω, e.g., the same characteristic impedance of 1Ω as the injection resistance, then no matching resistance is needed.

When the matching resistance and the injection resistance of the application probe portion (300) are arranged on the test substrate, pulses outputted from the TLP generator are introduced to the test substrate via a coaxial cable and a coaxial connector. As shown in FIGS. 21 to 25, a plurality of chip resistors are arranged radially in parallel near the connector of the test substrate. Alternatively, the matching resistance and the injection resistance are formed by annular or disk resistors.

Figure 21:
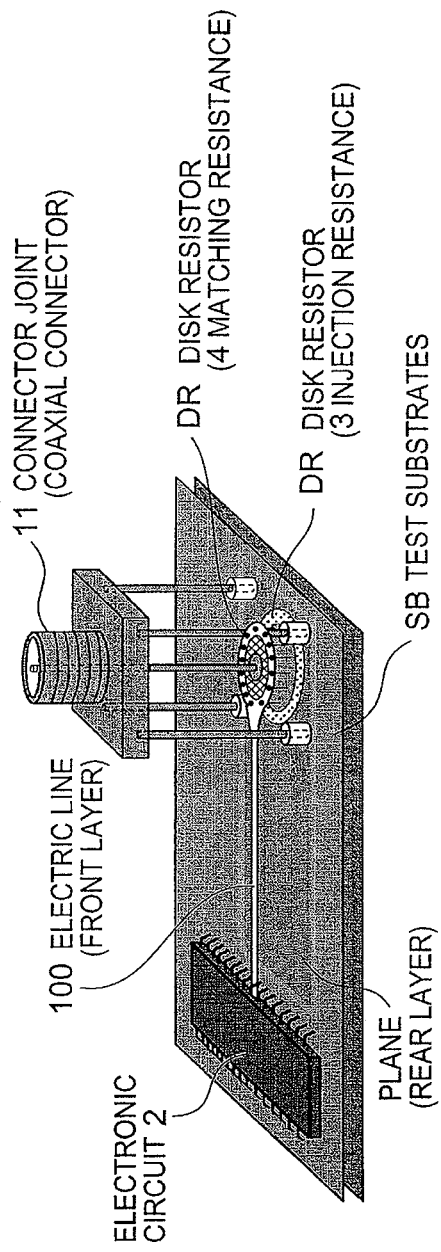
FIG. 21 is a diagram explanatory of an embodiment of the present invention.

In FIG. 21, annular disk resistors having different sizes are provided such that the matching resistance of 49Ω is located on a front face of the inner resistor while the injection resistance of 1Ω is located on a rear face of the outer resistor. An inner terminal of the rear face of the disk resistor is connected to an outer terminal of the front face of the matching resistance by vias. On the other hand, the outer side of the rear disk is originally formed of an electric line extending from the electric line 1 (100) and, for example, is connected to the power source and the ground, respectively, in a case where the electric line is connected to a power source pin or a ground pin of an LSI. If the test substrate SB includes a power source layer and a ground layer, it is preferable to provide a disk resistor of the injection resistance on each layer.

Figure 22:
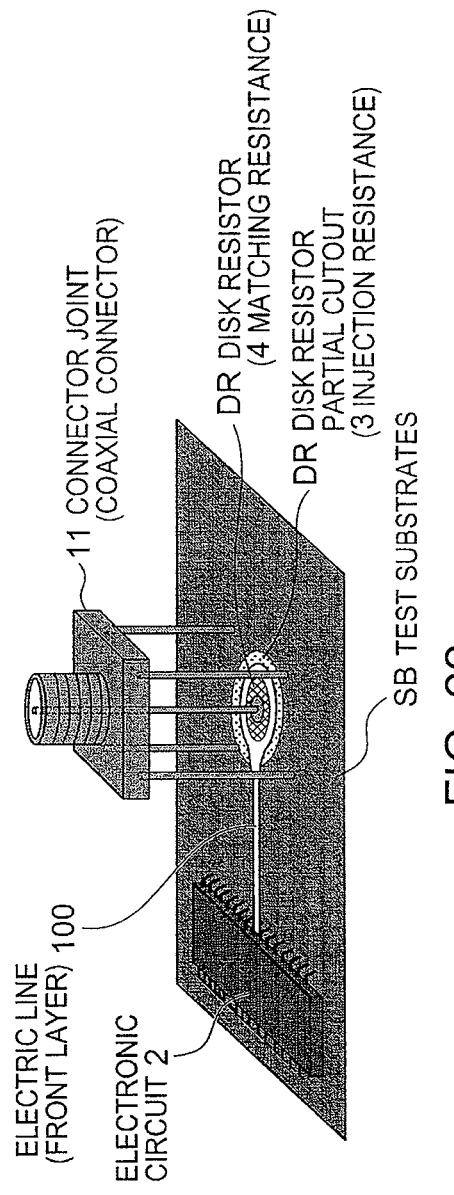
FIG. 22 is a diagram explanatory of an embodiment of the present invention.

In FIG. 22, a portion of the outer disk resistor (injection resistance) is cut such that the terminal of the matching resistance is connected to the electric line 1 (100) extending directly from an LSI. In such an arrangement, two layers as shown in FIG. 21 are not required, and a pattern can be drawn by using only the front face. Therefore, an increase of an additional inductance such as vias is prevented, so that the quality of application waveforms is further improved. Although FIGS. 21 and 22 are diagrams showing that the connector is attached onto the front face of the test substrate SB, the connector may be inserted from the rear face of the test substrate SB when the disk resistor has a large thickness.

Figure 23:
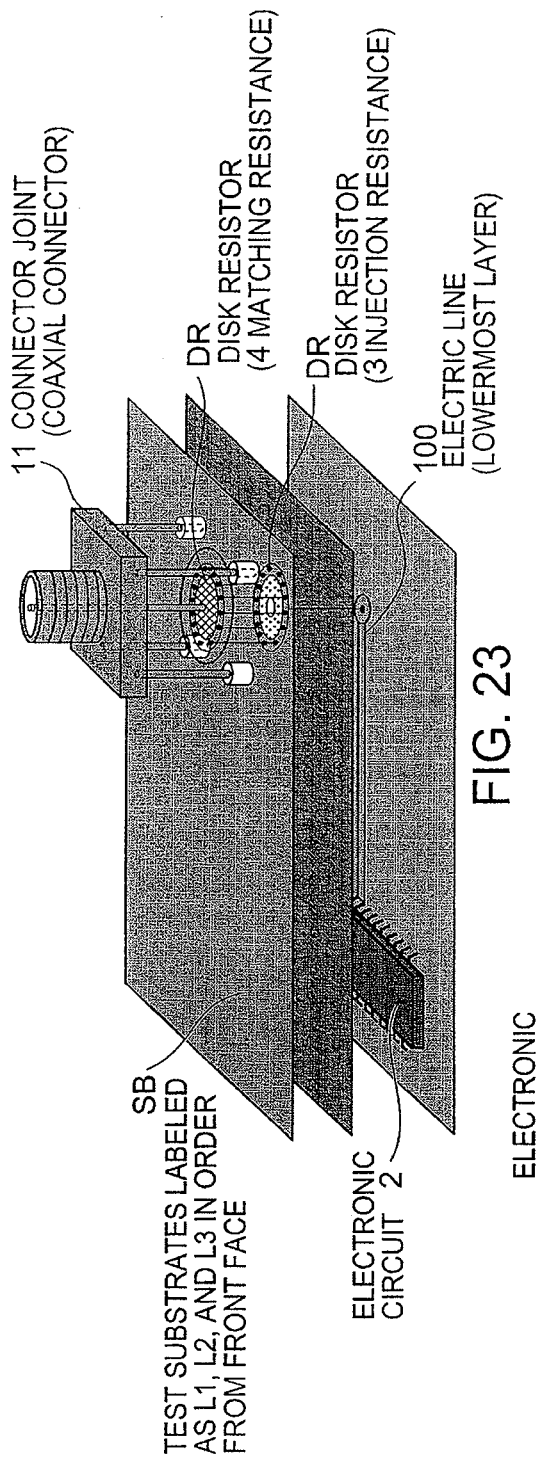
FIG. 23 is a diagram explanatory of an embodiment of the present invention.

In FIG. 23, two of the same disk resistors as shown in FIG. 21 are used to form an injection resistance and a matching resistance. In the case where the disk resistors have the same size, an LSI of an electronic circuit to be tested is arranged on the third layer as shown in FIG. 23. The layer configuration of a multilayer substrate should be ingeniously utilized so that the electric line 1 (100) from the LSI goes across the layers as infrequently as possible.

Figure 24:
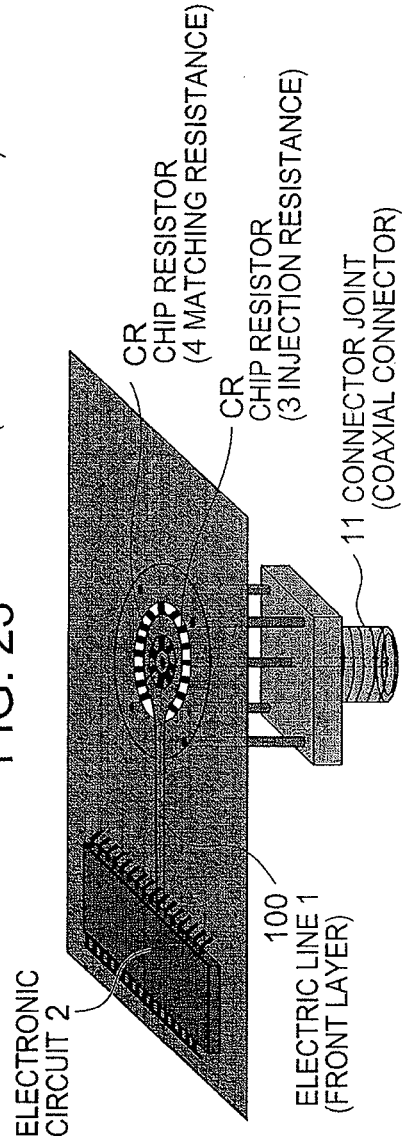
FIG. 24 is a diagram explanatory of an embodiment of the present invention.

In FIG. 24, chip resistors are radially arranged instead of the disk resistors. It is preferable to arrange the chip resistors as close as possible for improving the characteristics. Furthermore, although the combined resistance of the parallel connection should be adjusted, for example, with the matching resistance of 49Ω and the injection resistance of 1Ω in total, it is preferable to equally arrange resistors having the same resistance for improving the characteristics.

Figure 25:
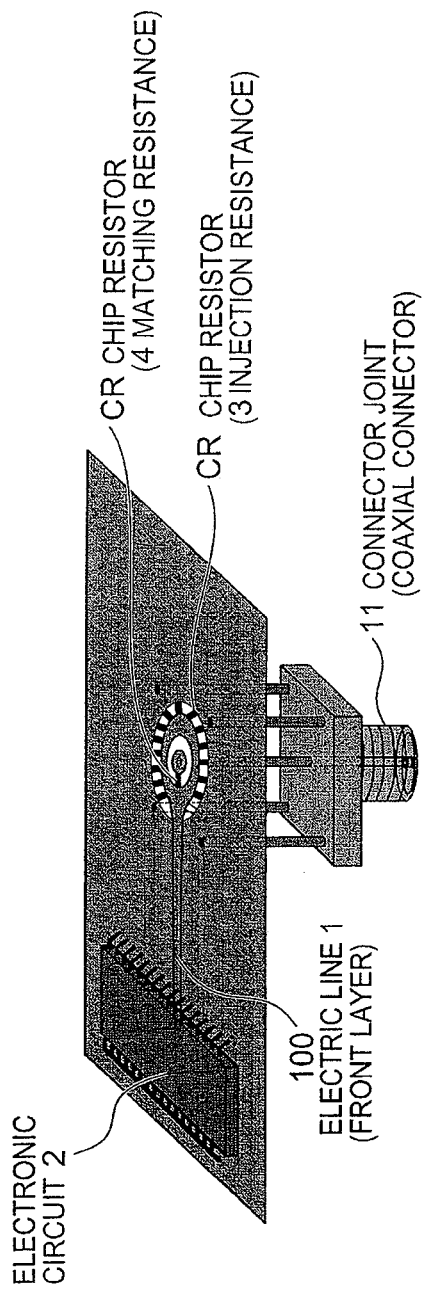
FIG. 25 is a diagram explanatory of an embodiment of the present invention.

FIG. 25 is a configuration diagram showing a variation of FIG. 24 in which the matching resistance near a central portion is substantially formed by one resistor. As compared to the example of FIG. 24, this variation may exhibit slightly deteriorated characteristics.

Figure 26:
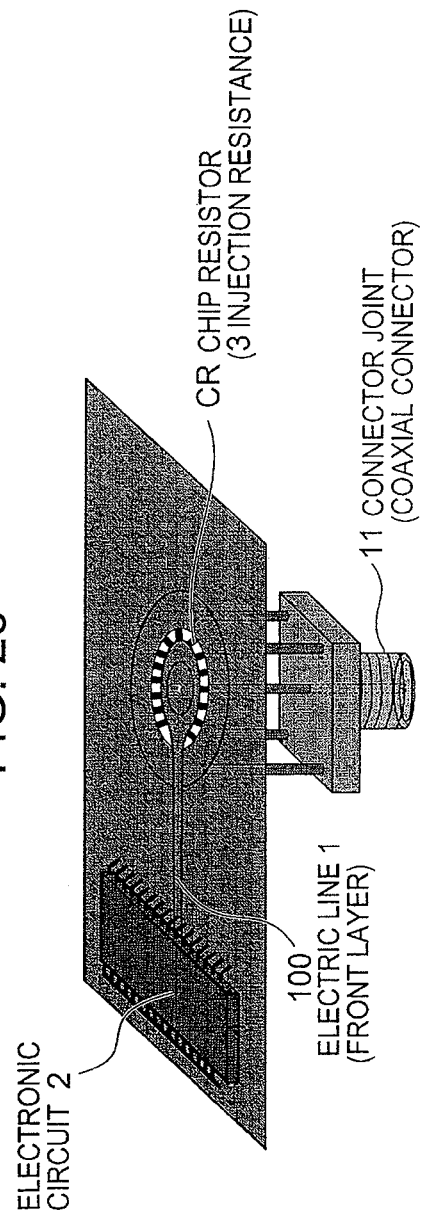
FIG. 26 is a diagram explanatory of an embodiment of the present invention.
Figure 27:
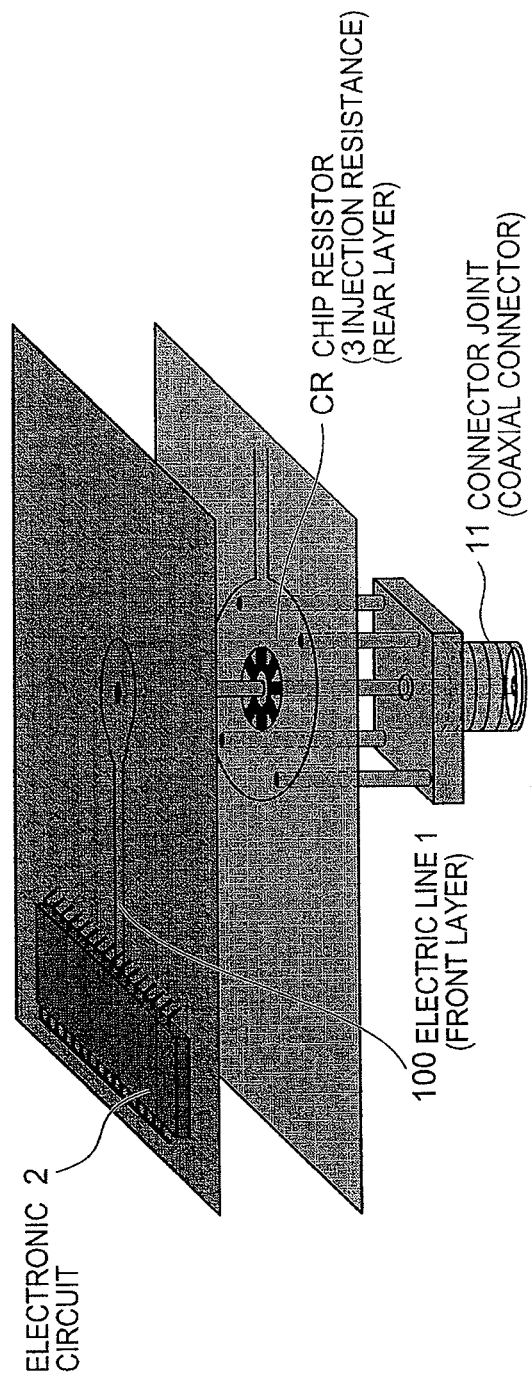
FIG. 27 is a diagram explanatory of an embodiment of the present invention.

FIG. 26 is a diagram of a case in which the TLP generator and the coaxial line are formed by a coaxial line having the same characteristic impedance as the injection resistance. In this case, no matching resistance is needed. Therefore, only injection resistances are radially arranged, and some of inner electrodes are drawn and connected to the electric line 1 (100). In order to avoid drawing the electrodes, one layer may be divided into multiple layers as shown in FIG. 27. In FIG. 27, a core wire of the coaxial line is drawn to the front face and connected to the electric line 1 (100). In this example, chip resistors are radially arranged on the rear face so as to have a combined resistance of 1Ω. As a matter of course, however, those chip resistors may be replaced with an annular disk resistor, which is not shown. In FIG. 26, if a thin annular resistance having a partial cutout is arranged on the front face, then the connector can be mounted on the front layer, thereby achieving application with good characteristics.

In FIGS. 21 to 27, legs of the connectors are illustrated as being long for convenience's sake to show the features of those configurations. As a matter of course, however, those legs should be as short as possible.

In a case where the matching resistance or the injection resistance is provided inside of the coaxial connector, those are arranged in the following manner. Specifically, a small-sized chip resistor is loaded as the matching resistance on the inner conductor of the coaxial line, i.e., on an extension of the inner conductor and is connected to the inner electrode of the disk resistor located on the extension. The outer conductor, i.e., a shield of the coaxial line is connected to the outer conductor of the coaxial connector. In order to prevent reflection on the matching resistance as much as possible, it is necessary to connect the respective elements in the shortest distance and uniformly connect the outer conductor. In a case of a value at which a disk resistor cannot be used, chip resistors are arranged radially uniformly as shown in FIG. 15 to prevent biased reflection characteristics in the injection resistance. In this example, the injection resistance is 1Ω, and a disk resistor is used. If the injection resistance is 0.2Ω, five chip resistors of 1Ω are radially connected.

When there are a plurality of electronic circuits to be tested, the same voltage can be applied to any measurement point if the matching resistance and the injection resistance are provided on the application probe. With the configuration in which the injection resistance is provided on the test substrate, attention should be paid to variations of values of respective injection resistances. Even with the same voltage on the TLP generator, applied voltages may be different depending upon a ratio of the matching resistance and the injection resistance. Therefore, it is necessary to take some measures such as prearrangement of the resistance ratio.

Figure 19:
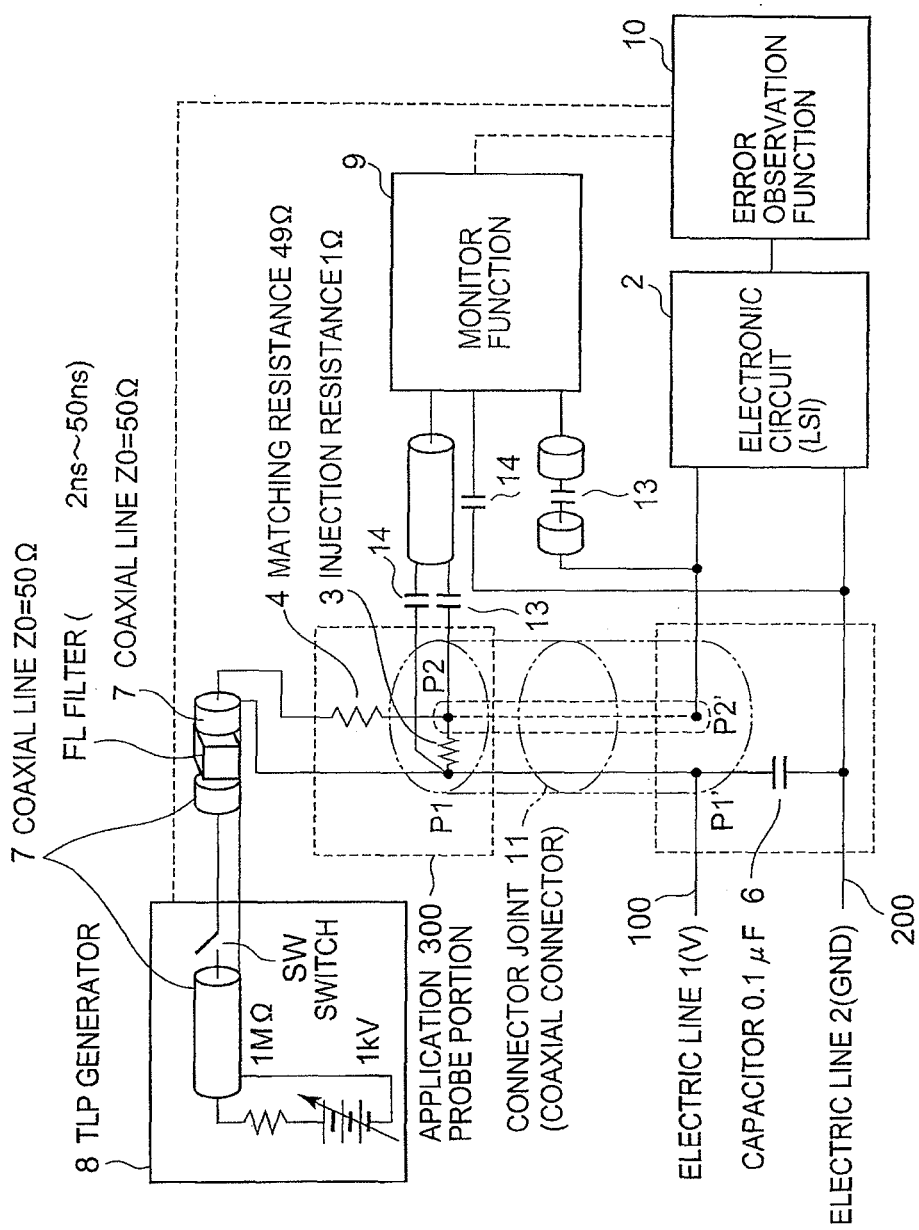
FIG. 19 is a diagram showing an example of the present invention.

In FIG. 19, the matching resistance and the injection resistance are disposed in the application probe portion (300). A capacitor (of 0.1 μF in this example) inserted between the electric line 1 (100) and the electric line 2 (200) is disposed on the test substrate.

Specifically, the electronic circuit is an LSI or the like. In this example, for example, a logic LSI having a power source voltage of 3.3 V is used, and the electric line 1 (100) and the electric line 2 (200) correspond to the power source (V) and the ground (GND), respectively. The LSI is designed such as to repeat a high output and a low output to an output port at intervals of 1 second. Abnormal operation of the output port is monitored by the error observation function. Application points should preferably be located near the power source pin and the ground pin of the LSI. Furthermore, the aforementioned capacitor between the power source and the ground is connected to a portion that is just close to the application point and is nearer to the power source (opposite to the LSI).

The error observation function conducts voltage setting of the TLP generator and automatic setting of application timing in addition to monitoring of an abnormal operation of the output port. The power source of the TLP generator is increased from an initial voltage ($V_0$=0.1 kV) by voltage increments ($\Delta V$=0.01 kV). At that time, occurrence of an abnormal operation is monitored. The application voltage is thus increased gradually, and an immunity voltage is determined as an application voltage applied when an error is observed. Generally, the power source voltage of the applying TLP is used for the immunity voltage in many cases. However, a voltage actually applied between the power source and the ground of the LSI may be measured by the monitor function, and an immunity may refer to a peak value of a rectangular wave outputted by the monitor function (a peak value output function of an oscilloscope) when an error occurs. Here, the immunity is used in the context of the latter case.

The monitor function can monitor two measurement systems including a voltage between the power source (V) and the ground (GND) and a voltage applied across the injection resistance (a voltage actually applied to the electric line 1 (100)). In this case, capacitive coupling is made because an oscilloscope, which serves as the monitor function, separates the two measurement systems in a direct current scheme. At that time, with use of the configuration shown in FIGS. 17 and 18, disturbance of the characteristic impedance can be minimized.

Figure 20:
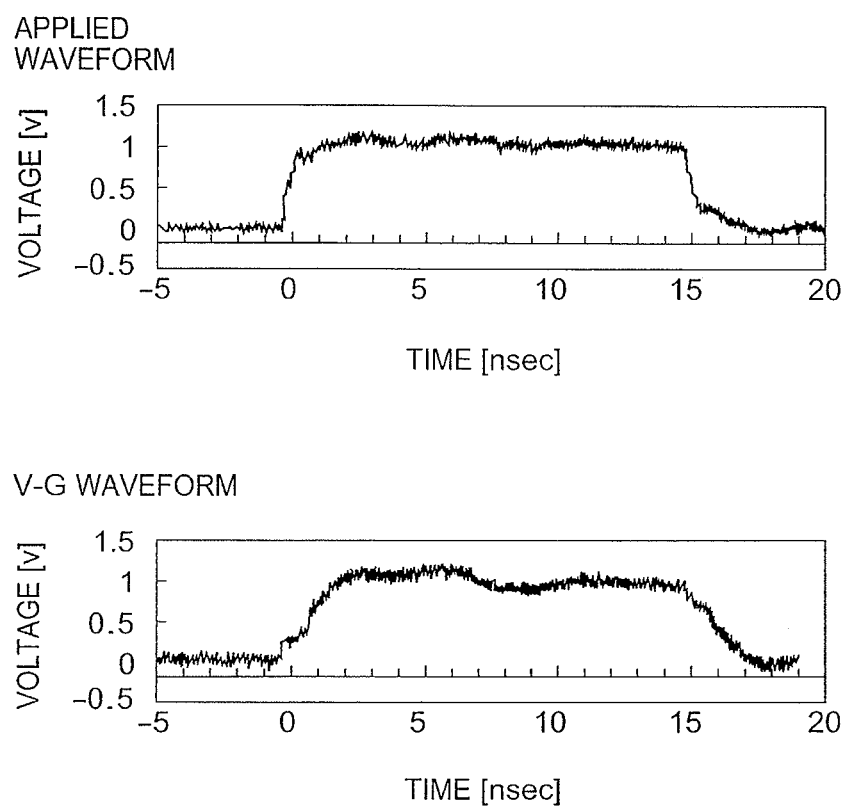
FIG. 20 is a diagram showing examples of waveforms in rectangular wave application according to the present invention.

As described above, with an immunity test apparatus according to the present invention, a rectangular wave can be applied to an electronic circuit such as an LSI. An example is shown in FIG. 20. The power source voltage of the TLP generator was 1 kV, and the pulse duration was 15 ns. The upper graph shows a waveform of a voltage between opposite ends of the injection resistance, and the lower graph shows a waveform of a voltage between the power source and the GND of the tested LSI (V-G). The V-G voltage had a rise time that was slightly longer than that of the application voltage and was not an oscillating waveform. Thus, it can be seen that a rectangular wave (trapezoidal wave) could be applied. If the application voltage is applied in the negative direction, a negative rectangular wave can be applied.

Furthermore, use of a TLP generator as a rectangular wave generator allows a rectangular wave having an amplitude sufficient to cause an error to be applied to an electronic circuit that operates at a general power source voltage of several volts.

Thus, only a positive rectangular wave or a negative rectangular wave can be applied according to the present invention even though a conventional method of applying an oscillating waveform cannot determine whether an error is caused by positive voltage application or negative voltage application. Therefore, the level of the error can be detected accurately. Thus, it is possible to acquire important findings for error analysis and establishment of a plan for circuit precautions.

Although the present invention has been described with reference to some embodiments and examples, the present invention is not limited those embodiments and examples. It is apparent to those skilled in the art that various modifications can be made in the configuration and details of the present invention within the scope of the present invention.

The present application claims the benefit of Japanese Patent Application No. 2007-055153, filed on Mar. 6, 2007, the disclosure of which is incorporated herein in its entirety by reference.

The invention claimed is:

1. An impulse immunity test apparatus characterized by comprising:
   An electronic circuit to be tested, a first electric line extending from the electronic circuit,
   an injection resistance inserted in series on the first electric line which forms an application probe portion, and
   a rectangular wave generator operable to apply a rectangular wave to the injection resistance, wherein
   a peak value,
   a pulse duration, and
   a rise time of the rectangular wave generated by the rectangular wave generator are varied to examine occurrence of an error when the set rectangular wave is applied to the electronic circuit, wherein
   the rectangular wave generator comprises a TLP (Transmission Line Pulse) generator for applying electric charges accumulated in the coaxial line.

2. The impulse immunity test apparatus as recited in claim 1, characterized in that
   a filter for correcting a rise time is inserted in the coaxial line connected to the TLP generator.

3. An impulse immunity test apparatus characterized by comprising an electronic circuit to be tested, a first electric line extending from the electronic circuit, an injection resistance inserted in series on the first electric line which forms an application probe portion, a rectangular wave generator operable to generate a rectangular wave, a transmission line for transmitting the rectangular wave generated by the rectangular wave generator, and a matching resistance connecting the transmission line and the injection resistance to each other, the injection resistance is sufficiently lower than an output impedance of the rectangular wave generator 1, a characteristic impedance of the transmission line is substantially the same as the output impedance of the rectangular wave generator, and a sum of a value of the injection resistance in the application probe portion and a value of the matching resistance is substantially equal to the characteristic impedance of the transmission line, wherein the transmission line comprises a coaxial line, an end of the matching resistance is connected to an end of a central conductor of the coaxial line, another end of the matching resistance is connected to the P2 terminal on an end of the injection resistance, the P1 terminal on another end of the injection resistance is connected to an outer conductor of the coaxial line, the first electric line of the electronic circuit to be subjected to application is cut so as to have opposite ends of a P1' terminal and a P2' terminal, and the P1 terminal and the P2 terminal on both ends of the injection resistance form a connector joint with the P1' terminal and the P2' terminal of the first electric line opposed to the injection resistance, wherein the injection resistance comprises an annular disk resistor, the matching resistance comprises a chip resistor or a cylindrical resistor, the connector comprises a coaxial connector, a terminal of the matching resistance is connected to a tip of an inner conductor of the coaxial line, the P2 terminal as another terminal of the matching resistance is connected to a subcentral terminal of the disk resistor, the outer P1 terminal of the disk resistor is connected to an outer conductor of the coaxial line, the subcentral P2 terminal of the injection resistance is connected to a central conductor of the coaxial connector, and the outer P1 terminal of the injection resistance is connected to an outer conductor of the coaxial connector.

4. An impulse immunity test apparatus characterized by comprising an electronic circuit to be tested, a first electric line extending from the electronic circuit, an injection resistance inserted in series on the first electric line which forms an application probe portion, a rectangular wave generator operable to generate a rectangular wave, a transmission line for transmitting the rectangular wave generated by the rectangular wave generator, and a matching resistance connecting the transmission line and the injection resistance to each other, the injection resistance is sufficiently lower than an output impedance of the rectangular wave generator 1, a characteristic impedance of the transmission line is substantially the same as the output impedance of the rectangular wave generator, and a sum of a value of the injection resistance in the application probe portion and a value of the matching resistance is substantially equal to the characteristic impedance of the transmission line, wherein the transmission line comprises a coaxial line, an end of the matching resistance is connected to an end of a central conductor of the coaxial line, another end of the matching resistance is connected to the P2 terminal on an end of the injection resistance, the P1 terminal on another end of the injection resistance is connected to an outer conductor of the coaxial line, the first electric line of the electronic circuit to be subjected to application is cut so as to have opposite ends of a P1' terminal and a P2' terminal, and the P1 terminal and the P2 terminal on both ends of the injection resistance form a connector joint with the P1' terminal and the P2' terminal of the first electric line opposed to the injection resistance, wherein the injection resistance comprises an annular disk resistor, the matching resistance comprises a chip resistor or a cylindrical resistor, the connector comprises a coaxial connector, a terminal of the matching resistance is connected to a tip of an inner conductor of the coaxial line, the P2 terminal as another terminal of the matching resistance is connected to an inner conductor of the coaxial connector, an outer conductor of the coaxial line is connected to an outer conductor of the coaxial connector, the disk resistor is arranged in series on the first electric line, the subcentral P2' terminal of the disk resistor is connected to a central conductor of the coaxial connector as a receiver, and the outer P1' terminal of the disk resistor is connected to an outer conductor of the coaxial connector.

5. An impulse immunity test apparatus characterized by comprising:

An electronic circuit to be tested, a first electric line extending from the electronic circuit, an injection resistance inserted in series on the first electric line which forms an application probe portion, and a rectangular wave generator operable to apply a rectangular wave to the injection resistance, wherein a peak value, a pulse duration, and a rise time of the rectangular wave generated by the rectangular wave generator are varied to examine occurrence of an error when the set rectangular wave is applied to the electronic circuit, wherein the injection resistance comprises a plurality of chip resistors arranged radially with one end directed inward instead of an annular disk resistor, and inner ends and outer ends of the chip resistors are respectively connected to each other in a circular form.

6. An impulse immunity test apparatus characterized by comprising:

An electronic circuit to be tested, a first electric line extending from the electronic circuit, an injection resistance inserted in series on the first electric line which forms an application probe portion, and a rectangular wave generator operable to apply a rectangular wave to the injection resistance, wherein a peak value, a pulse duration, and a rise time of the rectangular wave generated by the rectangular wave generator are varied to examine occurrence of an error when the set rectangular wave is applied to the electronic circuit, wherein the application probe portion includes a second coaxial connector, the P2 terminal of the injection resistance and an inner conductor of the second coaxial connector are connected to each other, and the P1 terminal of the application terminal and an outer conductor of the coaxial connector 2 are connected to each other.

7. An impulse immunity test apparatus characterized by comprising:

An electronic circuit to be tested, a first electric line extending from the electronic circuit, an injection resistance inserted in series on the first electric line which forms an application probe portion, and a rectangular wave generator operable to apply a rectangular wave to the injection resistance, wherein a peak value, a pulse duration, and a rise time of the rectangular wave generated by the rectangular wave generator are varied to examine occurrence of an error when the set rectangular wave is applied to the electronic circuit, wherein a second capacitor is connected to the P2 terminal of the injection resistance, another end of the second capacitor is connected to an inner conductor of the second coaxial connector, and a plurality of third capacitors are arranged in a cylindrical form at equal intervals and connected to the P1 terminal of the injection resistance, and another end of each third capacitor is connected to an outer conductor of the second coaxial connector.

8. An impulse immunity test apparatus characterized by comprising:

An electronic circuit to be tested, a first electric line extending from the electronic circuit, an injection resistance inserted in series on the first electric line which forms an application probe portion, and
a rectangular wave generator operable to apply a rectangular wave to the injection resistance, wherein
a peak value,
a pulse duration, and
a rise time of the rectangular wave generated by the rectangular wave generator are varied to examine occurrence of an error when the set rectangular wave is applied to the electronic circuit, and
a monitor function of monitoring an application waveform,
the monitor function being disposed between the first electric line and the second electric line and between the injection resistance, the capacitor, the P2' terminal, or the P3' terminal and the electronic circuit; and
an error observation function of monitoring an error of the electronic circuit, wherein
a coaxial line connecting a P4 terminal and a P5 terminal of the first and second electric lines to the monitor function,
the coaxial line having a structure in which inner conductors are connected to each other in the shortest distance by a second capacitor, and
outer conductors are connected to each other in the shortest distance by a plurality of third capacitors arranged in a cylindrical form at equal intervals.

* * * * *